United States Patent
Ku et al.

(10) Patent No.: US 10,153,033 B2
(45) Date of Patent: Dec. 11, 2018

(54) SEMICONDUCTOR DEVICES

(71) Applicant: SK hynix Inc., Icheon (KR)

(72) Inventors: Sang Hyun Ku, Seongnam (KR); Min Su Park, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/620,678

(22) Filed: Jun. 12, 2017

(65) Prior Publication Data

US 2018/0174638 A1   Jun. 21, 2018

(30) Foreign Application Priority Data

Dec. 21, 2016 (KR) .................. 10-2016-0175756

(51) Int. Cl.
   *G11C 11/406*   (2006.01)
   *G11C 11/408*   (2006.01)
   *G11C 7/02*     (2006.01)

(52) U.S. Cl.
   CPC ............ *G11C 11/4087* (2013.01); *G11C 7/02* (2013.01); *G11C 11/406* (2013.01)

(58) Field of Classification Search
   CPC ............................................. G11C 11/40611
   USPC ........................................................ 711/106
   See application file for complete search history.

(56) References Cited

U.S. PATENT DOCUMENTS

| | | | | |
|---|---|---|---|---|
| 5,612,926 A | * | 3/1997 | Yazawa | G06F 5/14 348/E5.111 |
| 2010/0054048 A1 | * | 3/2010 | Cheng | G11C 16/3468 365/189.07 |
| 2013/0304982 A1 | * | 11/2013 | Jung | G11C 11/40622 711/106 |
| 2014/0003173 A1 | * | 1/2014 | Ku | G11C 29/04 365/200 |
| 2014/0006704 A1 | * | 1/2014 | Greenfield | G06F 11/3037 711/106 |
| 2014/0059287 A1 | * | 2/2014 | Bains | G11C 11/40615 711/106 |
| 2014/0177370 A1 | * | 6/2014 | Halbert | G11C 11/40603 365/222 |

FOREIGN PATENT DOCUMENTS

KR   10-2014-0146434 A   12/2014

* cited by examiner

*Primary Examiner* — Min Huang (57) ABSTRACT

A semiconductor device includes a counter control signal generation circuit and an access information generation circuit. The counter control signal generation circuit generates a count enablement signal, a reset signal and a count increment signal in response to a first row address selected as a target address and a second row address selected as a neighboring address. The access information generation circuit receives the count enablement signal, the reset signal and the count increment signal to generate a first access information signal including information on the number of times that the target address is selected and a second access information signal including information on the number of times that the neighboring address is selected.

20 Claims, 8 Drawing Sheets

| | RADD<1> | RADD<2> | ... | RADD<N-2> | RADD<N-1> | RADD<N> | RADD<N+1> | RADD<N+2> | ... | RADD<L> |
|---|---|---|---|---|---|---|---|---|---|---|
| J=2 | | | | | NADD<1> | TADD | NADD<2> | | | |
| J=4 | | | | NADD<1> | NADD<2> | TADD | NADD<3> | NADD<4> | | |

SEMICONDUCTOR DEVICES

CROSS-REFERENCE TO RELATED APPLICATIONS

The present application claims priority under 35 U.S.C 119(a) to Korean Patent Application No. 10-2016-0175756, filed on Dec. 21, 2016, which is herein incorporated by references in its entirety.

BACKGROUND

1. Technical Field

Embodiments of the present disclosure relate to semiconductor devices executing a refresh operation.

2. Related Art

A semiconductor device such as a dynamic random access memory (DRAM) device includes a plurality of memory cells for storing data. Each of DRAM cells is configured to include a cell capacitor and a cell transistor. The DRAM device stores data therein by discharging or charging the cell capacitors. Once the cell capacitor is charged or discharged to store a datum therein, an amount of electric charge stored in the cell capacitor is ideally constant over time. However, the amount of electric charge stored in the cell capacitor actually varies because of a voltage difference between the cell capacitor and a circuit adjacent to the cell capacitor or because of a leakage current of the cell capacitor. In particular, if the amount of electric charge stored in the cell capacitor is reduced, the cell capacitor may lose a datum stored therein, resulting in a malfunction of the DRAM device. Thus, the DRAM device may require a refresh operation to prevent the memory cells from losing their data.

As a semiconductor device becomes more highly integrated with the development of process technologies, a distance between memory cells as well as a distance between word lines connected to the memory cells has been continuously reduced. If the distance between the word lines is reduced, data stored in memory cells adjacent to a selected memory cell may be changed due to a coupling phenomenon or an interference phenomenon between the word lines.

SUMMARY

Recently, an additional refresh scheme has been applied to a word line adjacent to a target word line, which is frequently accessed or activated, in order to prevent memory cells connected to the adjacent word line from losing their data due to the interference phenomenon between the word lines. The additional refresh scheme applied to the adjacent word line is referred to as 'smart refresh.'

Various embodiments are directed to semiconductor devices counting up the number of times that word lines are selected to perform a smart refresh operation.

According to an embodiment, a semiconductor device includes a counter control signal generation circuit and an access information generation circuit. The counter control signal generation circuit generates a count enablement signal, a reset signal and a count increment signal in response to a first row address selected as a target address and a second row address selected as a neighboring address. The access information generation circuit receives the count enablement signal, the reset signal and the count increment signal to generate a first access information signal including information on the number of times that the target address is selected and a second access information signal including information on the number of times that the neighboring address is selected.

According to another embodiment, a semiconductor device includes a control signal generation circuit, an information storage circuit and a counter. The control signal generation circuit generates a first output control signal, a first input control signal and a reset signal in response to a first row address selected as a target address during a first period. In addition, the control signal generation circuit generates a second output control signal, a second input control signal and a count increment signal in response to a second row address selected as a neighboring address during a second period. The information storage circuit outputs or stores a first access information signal including information on the number of times that the target address is selected and a second access information signal including information on the number of times that the neighboring address is selected, in response to the first output control signal, the first input control signal, the second output control signal and the second input control signal. The counter resets or counts the first access information signal and the second access information signal in response to the reset signal and the count increment signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
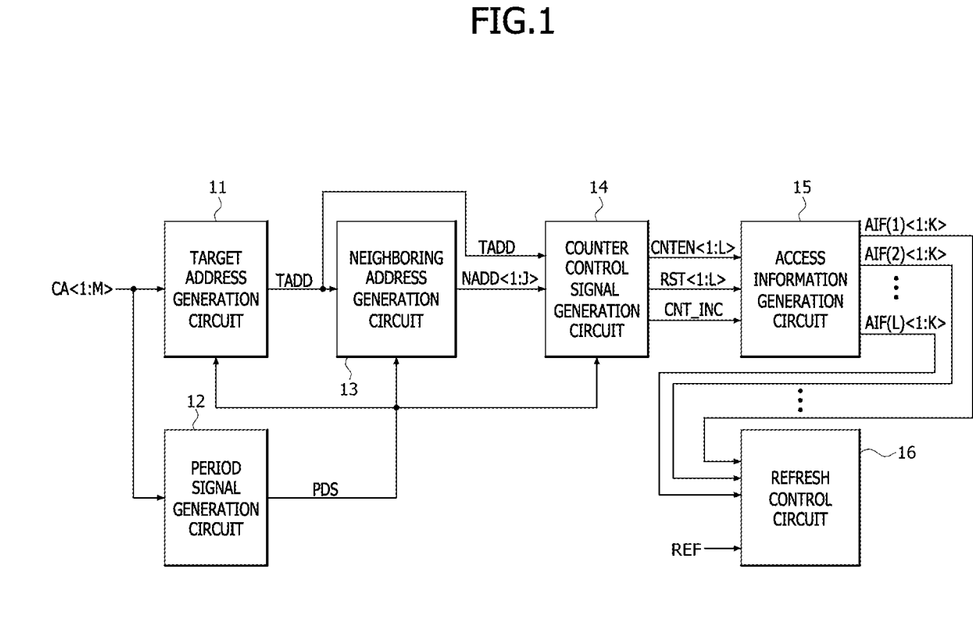
FIG. 1 is a block diagram illustrating a semiconductor device according to an embodiment of the present disclosure.

FIG. 1 is a block diagram illustrating a semiconductor device according to an embodiment of the present disclosure. The semiconductor device may include a target address generation circuit 11, a period signal generation circuit 12, a neighboring address generation circuit 13, a counter control signal generation circuit 14, an access information generation circuit 15, and a refresh control circuit 16.

The target address generation circuit 11 may generate a target address TADD, which is based on data of address bits included in a command/address signal CA<1:M>, in response to a period signal PDS, M being a positive integer. The target address generation circuit 11 may decode the data of the address bits included in the command/address signal CA<1:M> and generate the target address TADD during a period when a predetermined internal operation is performed, in response to the period signal PDS. The command/address signal CA<1:M> may include at least one of a command and an address signal. The number "M" of bits included in the command/address signal CA<1:M> may be set at different values according to different embodiments. The target address TADD may be generated by decoding the data of the address bits included in the command/address signal CA<1:M>, and may be set to correspond to a row address, which is enabled. The row address may be enabled to activate any one of word lines. The enabled row address may change according to a logic level combination of the data of the address bits included in the command/address signal CA<1:M>.

The period signal generation circuit 12 may generate the period signal PDS, which is enabled during a predetermined period, based on the command/address signal CA<1:M>. The period signal generation circuit 12 may decode data of command bits included in the command/address signal CA<1:M> and generate the period signal PDS, which is enabled during the period when the predetermined internal operation is performed. For example, the period signal generation circuit 12 may decode data of the command bits included in the command/address signal CA<1:M> and generate the period signal PDS, which is enabled during a period when an active operation is performed. The period signal PDS may be enabled during a period when at least one of various internal operations, such as a read operation, a write operation, a refresh operation, and a standby operation, is performed according to an embodiment.

In an embodiment, the command of the command/address signal CA<1:M> may include data of the command bits, and the address signal of the command/address signal CA<1:M> may include data of the address bits. M corresponds to a sum of the number of command bits and the number of address bits.

The neighboring address generation circuit 13 may generate first to $J^{th}$ neighboring addresses NADD<1:J> based on the target address TADD, in response to the period signal PDS, J being a positive integer. The neighboring address generation circuit 13 may select row addresses neighboring with the row address corresponding to the target address TADD as the first to $J^{th}$ neighboring addresses NADD<1:J> during the period when the predetermined internal operation is performed, in response to the period signal PDS. The number "J" of bits included in the first to $J^{th}$ neighboring addresses NADD<1:J> may change according to embodiments. An operation in which the target address TADD and the first to $J^{th}$ neighboring addresses NADD<1:J> are selected will be described in detail with reference to FIG. 2.

The counter control signal generation circuit 14 may generate first to $L^{th}$ count enablement signals CNTEN<1:L>, first to $L^{th}$ reset signals RST<1:L>, and a count increment signal CNT_INC based on the target address TADD and the first to $J^{th}$ neighboring addresses NADD<1:J>, in response to the period signal PDS, L being a positive integer. The counter control signal generation circuit 14 may generate the first to $L^{th}$ reset signals RST<1:L>, which are selectively enabled in order to reset counters (not shown). The counters may count the number of times that the row address corresponding to the target address TADD is selected during a period when a predetermined internal operation is performed, in response to the period signal PDS.

The counter control signal generation circuit 14 may generate the first to $L^{th}$ count enablement signals CNTEN<1:L>, which are selectively enabled in order to activate the counters (not shown), the counters counting up the number of times that row addresses corresponding to the first to $J^{th}$ neighboring addresses NADD<1:J> are selected during a period when a predetermined internal operation is performed, in response to the period signal PDS. The counter control signal generation circuit 14 may generate a count increment signal CNT_INC, which is enabled when the target address TADD is selected during the period when the predetermined internal operation is performed, in response to the period signal PDS.

The access information generation circuit 15 may generate first to $L^{th}$ access information signals AIF(1)<1:K>~AIF(L)<1:K> based on the first to $L^{th}$ count enablement signals CNTEN<1:L>, the first to $L^{th}$ reset signals RST<1:L>, and the count increment signal CNT_INC, K being a positive integer. The access information generation circuit 15 may selectively count when one of the first to $L^{th}$ access information signals AIF(1)<1:K>~AIF(L)<1:K> corresponds to any one of the first to $L^{th}$ count enablement signals CNTEN<1:L> that is enabled, and output the selected access information signal that has a value incremented by one each time the circuit 15 counts. The access information generation circuit 15 may selectively count in response to the count increment signal CNT_INC.

For example, if the $N^{th}$ count enablement signal CNTEN<N> and the count increment signal CNT_INC are enabled when the $N^{th}$ access information signal AIF(N)<1:3> has a logic level combination of '010,' the $N^{th}$ access information signal AIF(N)<1:3> may be counted up by an increment of one, e.g., '001,' to have a logic level combination of '011.' In the $N^{th}$ access information signal AIF(N)<1:3>, the logic level combination of '011' means that second and third bits AIF(N)<2:3> of the $N^{th}$ access information signal AIF(N)<1:3> have a logic "high(1)" level and a first bit AIF(N)<1> of the $N^{th}$ access information signal AIF(N)<1:3> has a logic "low(0)" level. A configuration of the access information generation circuit 15 will be described in detail with reference to FIG. 3.

The refresh control circuit 16 may perform a refresh operation in response to the first to $L^{th}$ access information signals AIF(1)<1:K>~AIF(L)<1:K>. The refresh control circuit 16 may perform a refresh operation for memory cells (not shown) selected by a row address corresponding to a specific one of the first to $L^{th}$ access information signals AIF(1)<1:K>~AIF(L)<1:K>, when the specific access information signal is counted by more than a predetermined number of times (or maximum counter value).

Figure 2:
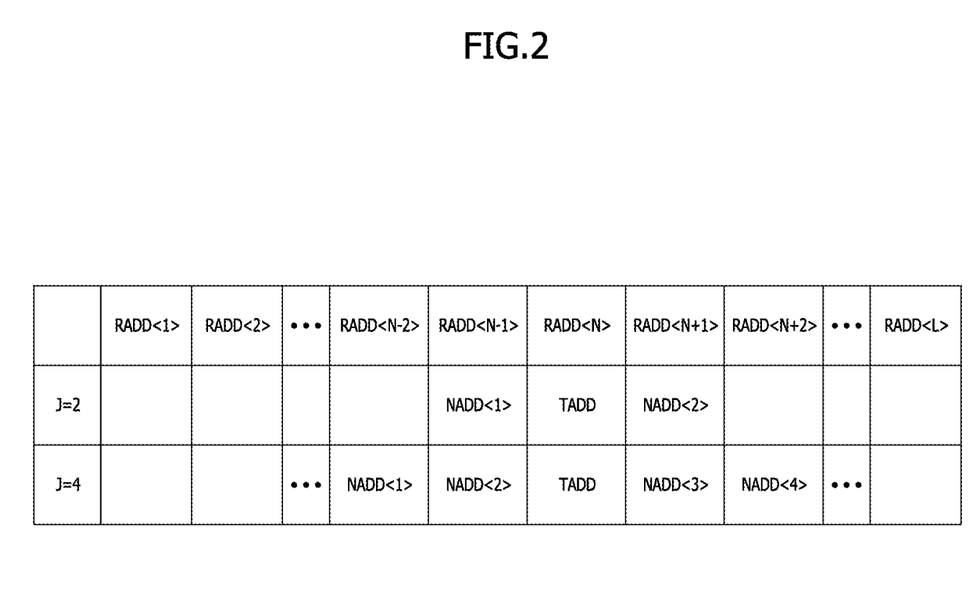
FIG. 2 is a table illustrating a target address and neighboring addresses, which are set in the semiconductor device of FIG. 1.

FIG. 2 is a table illustrating a target address and neighboring addresses, which are set in the semiconductor device of FIG. 1. Referring to FIG. 2, an operation in which the target address TADD and the first to $J^{th}$ neighboring addresses NADD<1:J> are selected from first to $L^{th}$ row addresses RADD<1:L> may be determined according to the number "J" of bits included in the first to $J^{th}$ neighboring addresses NADD<1:J>. The first to $L^{th}$ row addresses RADD<1:L> may be generated by decoding the data of the address bits of the command/address signal CA<1:M>, and may include bits, one of which is selectively enabled. If the $N^{th}$ row address RADD<N> is selected as the target address TADD when the number "J" of bits included in the first to $J^{th}$ neighboring addresses NADD<1:J> is two, the $(N-1)^{th}$ row address RADD<N-1> may be selected as the first neighboring address NADD<1> and the $(N+1)^{th}$ row address RADD<N+1> may be selected as the second neighboring address NADD<2>. If the $N^{th}$ row address RADD<N> is selected as the target address TADD when the number "J" of bits included in the first to $J^{th}$ neighboring addresses NADD<1:J> is four, the $(N-2)^{th}$ row address RADD<N-2>, the $(N-1)^{th}$ row address RADD<N-1>, the $(N+1)^{th}$ row address RADD<N+1>, and the $(N+2)^{th}$ row address RADD<N+2> may be selected as the first to fourth neighboring addresses NADD<1:4>, respectively.

Figure 3:
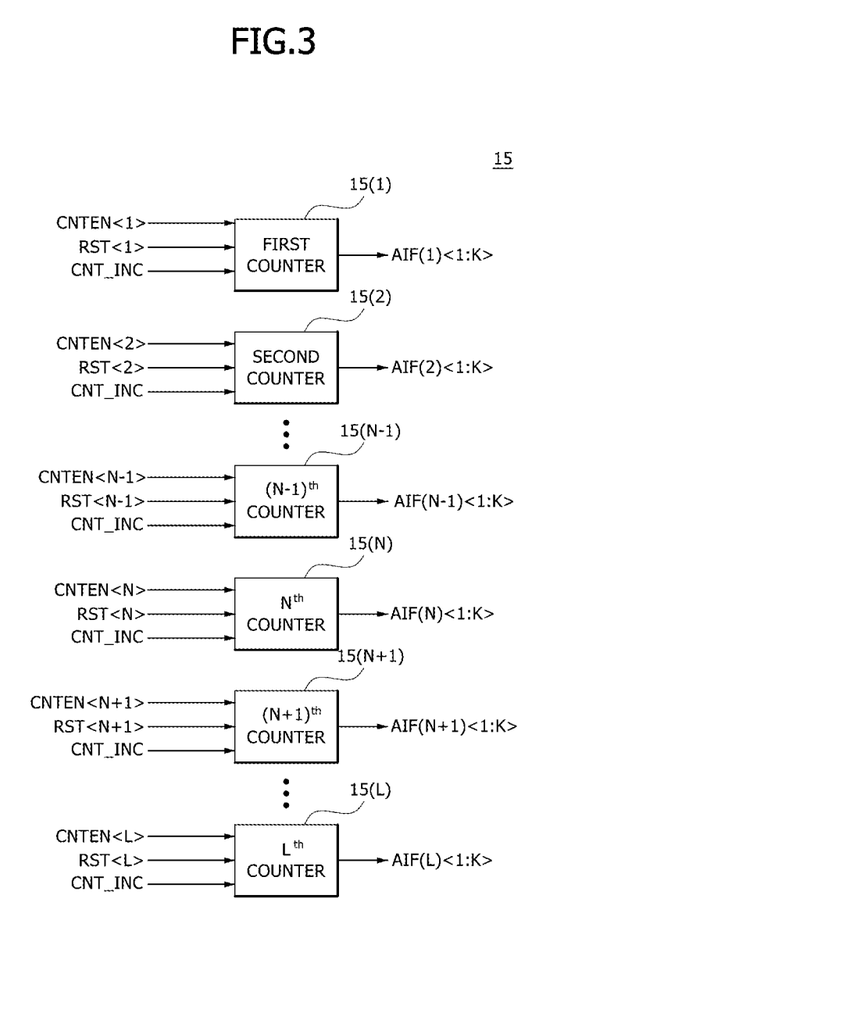
FIG. 3 is a block diagram illustrating an access information generation circuit included in the semiconductor device of FIG. 1 according to an embodiment of the present disclosure.

FIG. 3 is a block diagram illustrating the access information generation circuit 15 included in the semiconductor device of FIG. 1 according to an embodiment of the present disclosure. The access information generation circuit 15 may include first to $L^{th}$ counters 15(1)~15(L).

The first counter 15(1) may generate the first access information signal AIF(1)<1:K> based on the first count enablement signal CNTEN<1>, the first reset signal RST<1>, and the count increment signal CNT_INC. The first counter 15(1) may output the first access information signal AIF(1)<1:K>, which is counted when the first count enablement signal CNTEN<1> and the count increment signal CNT_INC are enabled. The first access information signal AIF(1)<1:K> may be counted by increasing a value of the first access information signal AIF(1)<1:K> by an increment of one. The first counter 15(1) may initialize the first access information signal AIF(1)<1:K>, so that the first access information signal AIF(1)<1:K> has an initial value, if the first reset signal RST<1> is enabled. The first access information signal AIF(1)<1:K> may be initialized so that all of bits included in the first access information signal AIF(1)<1:K> have a logic "low" level. The initial value of the first access information signal AIF(1)<1:K> may be set at different values according to different embodiments.

The second counter 15(2) may generate the second access information signal AIF(2)<1:K> based on the second count enablement signal CNTEN<2>, the second reset signal RST<2>, and the count increment signal CNT_INC. The second counter 15(2) may output the second access information signal AIF(2)<1:K> that is counted when the second count enablement signal CNTEN<2> and the count increment signal CNT_INC are enabled. The second access information signal AIF(2)<1:K> may be counted by increasing a value of the second access information signal AIF(2)<1:K> by an increment of one. The second counter 15(2) may initialize the second access information signal AIF(2)<1:K>, such that the second access information signal AIF(2)<1:K> has an initial value, if the second reset signal RST<2> is enabled. The second access information signal AIF(2)<1:K> may be initialized so that all of bits included in the second access information signal AIF(2)<1:K> have a logic "low" level. The initial value of the second access information signal AIF(2)<1:K> may be set at different values according to different embodiments.

The $(N-1)^{th}$ counter 15(N-1) may generate the $(N-1)^{th}$ access information signal AIF(N-1)<1:K> based on the $(N-1)^{th}$ count enablement signal CNTEN<N-1>, the $(N-1)^{th}$ reset signal RST<N-1>, and the count increment signal CNT_INC. The $(N-1)^{th}$ counter 15(N-1) may output the $(N-1)^{th}$ access information signal AIF(N-1)<1:K> that is counted when the $(N-1)^{th}$ count enablement signal CNTEN<N-1> and the count increment signal CNT_INC are enabled. The $(N-1)^{th}$ access information signal AIF(N-1)<1:K> may be counted by increasing a value of the $(N-1)^{th}$ access information signal AIF(N-1)<1:K> by an increment of one. The $(N-1)^{th}$ counter 15(N-1) may initialize the $(N-1)^{th}$ access information signal AIF(N-1)<1:K> so that the $(N-1)^{th}$ access information signal AIF(N-1)<1:K> has an initial value, if the $(N-1)^{th}$ reset signal RST<N-1> is enabled. The $(N-1)^{th}$ access information signal AIF(N-1)<1:K> may be initialized so that all of bits included in the $(N-1)^{th}$ access information signal AIF(N-1)<1:K> have a logic "low" level. The initial value of the $(N-1)^{th}$ access information signal AIF(N-1)<1:K> may be set at different values according to different embodiments.

The $N^{th}$ counter 15(N) may generate the $N^{th}$ access information signal AIF(N)<1:K> based on the $N^{th}$ count enablement signal CNTEN<N>, the $N^{th}$ reset signal RST<N>, and the count increment signal CNT_INC. The $N^{th}$ counter 15(N) may output the $N^{th}$ access information signal AIF(N)<1:K> that is counted when the $N^{th}$ count enablement signal CNTEN<N> and the count increment signal CNT_INC are enabled. The $N^{th}$ access information signal AIF(N)<1:K> may be counted by increasing a value of the $N^{th}$ access information signal AIF(N)<1:K> by an increment of one. The $N^{th}$ counter 15(N) may initialize the $N^{th}$ access information signal AIF(N)<1:K> so that the $N^{th}$ access information signal AIF(N)<1:K> has an initial value, if the $N^{th}$ reset signal RST<N> is enabled. The $N^{th}$ access information signal AIF(N)<1:K> may be initialized such that all of bits included in the $N^{th}$ access information signal AIF(N)<1:K> have a logic "low" level. The initial value of the $N^{th}$ access information signal AIF(N)<1:K> may be set at different values according to different embodiments.

The $(N+1)^{th}$ counter 15(N+1) may generate the $(N+1)^{th}$ access information signal AIF(N+1)<1:K> based on the $(N+1)^{th}$ count enablement signal CNTEN<N+1>, the $(N+1)^{th}$ reset signal RST<N+1>, and the count increment signal CNT_INC. The $(N+1)^{th}$ counter 15(N+1) may output the $(N+1)^{th}$ access information signal AIF(N+1)<1:K> that is counted when the $(N+1)^{th}$ count enablement signal CNTEN<N+1> and the count increment signal CNT_INC are enabled. The $(N+1)^{th}$ access information signal AIF(N+1)<1:K> may be counted by increasing a value of the $(N+1)^{th}$ access information signal AIF(N+1)<1:K> by an increment of one. The $(N+1)^{th}$ counter 15(N+1) may initialize the $(N+1)^{th}$ access information signal AIF(N+1)<1:K> so that the $(N+1)^{th}$ access information signal AIF(N+1)<1:K> has an initial value, if the $(N+1)^{th}$ reset signal RST<N+1> is enabled. The $(N+1)^{th}$ access information signal AIF(N+1)<1:K> may be initialized so that all of bits included in the $(N+1)^{th}$ access information signal AIF(N+1)<1:K> have a logic "low" level. The initial value of the $(N+1)^{th}$ access information signal AIF(N+1)<1:K> may be set at different values according to different embodiments.

The $L^{th}$ counter 15(L) may generate the $L^{th}$ access information signal AIF(L)<1:K> based on the $L^{th}$ count enablement signal CNTEN<L>, the $L^{th}$ reset signal RST<L>, and the count increment signal CNT_INC. The $L^{th}$ counter 15(L) may output the $L^{th}$ access information signal AIF(L)<1:K> that has been counted when the $L^{th}$ count enablement signal CNTEN<L> and the count increment signal CNT_INC are enabled. The $L^{th}$ access information signal AIF(L)<1:K> may be counted by increasing a value of the $L^{th}$ access information signal AIF(L)<1:K> by an increment of one. The $L^{th}$ counter 15(L) may initialize the $L^{th}$ access information signal AIF(L)<1:K> so that the $L^{th}$ access information signal AIF(L)<1:K> has an initial value, if the $L^{th}$ reset signal RST<L> is enabled. The $L^{th}$ access information signal AIF(L)<1:K> may be initialized so that all of bits included in the L$^{th}$ access information signal AIF(L)<1:K> have a logic "low" level. The initial value of the L$^{th}$ access information signal AIF(L)<1:K> may be set at different values according to different embodiments.

Figure 4:
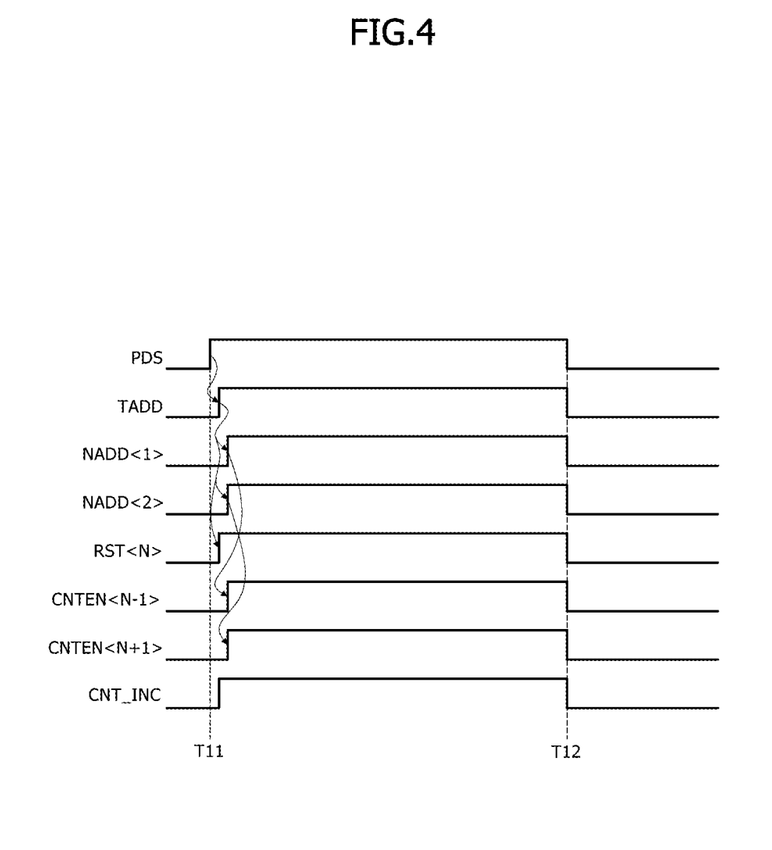
FIG. 4 is a timing diagram illustrating an operation of the semiconductor device illustrated in FIGS. 1, 2, and 3.

An operation of the semiconductor device having the aforementioned configuration illustrated in FIGS. 1 and 3 will be described hereinafter in detail with reference to FIG. 4 in conjunction with an example in which the number "J" of bits included in the first to J$^{th}$ neighboring addresses NADD<1:J> is two.

During a period from a point of time "T11" till a point of time "T12," the period signal PDS may be set to have a logic "high" level, and an active operation may be performed. The target address TADD may be selected in synchronization with a point of time when the period signal PDS is enabled to have a logic "high" level, and the first and second neighboring addresses NADD<1> and NADD<2> may be selected according to the target address TADD. The target address TADD and the first and second neighboring addresses NADD<1> and NADD<2> may be selected and generated from the first to L$^{th}$ row addresses RADD<1:L>, as described above with reference to FIG. 2. The first to L$^{th}$ row addresses RADD<1:L> may include bits, one of which is selectively enabled by decoding the address bits included in the command/address signal CA<1:M>.

In the present embodiment, the N$^{th}$ row address RADD<N> may be selected as the target address TADD, and the (N−1)$^{th}$ row address RADD<N−1> and the (N+1)$^{th}$ row address RADD<N+1> may be selected as the first and second neighboring addresses NADD<1> and NADD<2>, respectively.

Therefore, the N$^{th}$ reset signal RST<N> may be enabled to have a logic "high" level by the N$^{th}$ row address RADD<N>, which is selected as the target address TADD. The N$^{th}$ access information signal AIF(N)<1:K> including information on the number of times that the N$^{th}$ row address RADD<N> is selected as a neighboring address may be initialized to have an initial value in response to the N$^{th}$ reset signal RST<N>, which is enabled. That is, the N$^{th}$ row address RADD<N> is selected as the target address TADD, a value of the N$^{th}$ access information signal AIF(N)<1:K> is reset to the initial value.

The (N−1)$^{th}$ count enablement signal CNTEN<N−1> may be enabled to have a logic "high" level by the (N−1)$^{th}$ row address RADD<N−1>, which is selected as the first neighboring address NADD<1>. The (N−1)$^{th}$ access information signal AIF(N−1)<1:K> including information on the number of times that the (N−1)$^{th}$ row address RADD<N−1> is selected as a neighboring address may be counted in response to the (N−1)$^{th}$ count enablement signal CNTEN<N−1> and the count increment signal CNT_INC, which are enabled. The (N−1)$^{th}$ access information signal AIF(N−1)<1:K> may be counted by increasing a value of the (N−1)$^{th}$ access information signal AIF(N−1)<1:K> by an increment of one. That is, the (N−1)$^{th}$ row address RADD<N−1> is selected as a neighboring address, a value of the (N−1)$^{th}$ access information signal AIF(N−1)<1:K> is incremented by one.

The (N+1)$^{th}$ count enablement signal CNTEN<N+1> may be enabled to have a logic "high" level by the (N+1)$^{th}$ row address RADD<N+1>, which is selected as the second neighboring address NADD<2>. The (N+1)$^{th}$ access information signal AIF(N+1)<1:K> including information on the number of times that the (N+1)$^{th}$ row address RADD<N+1> is selected as a neighboring address may be counted in response to the (N+1)$^{th}$ count enablement signal CNTEN<N+1> and the count increment signal CNT_INC, which are enabled. The (N+1)$^{th}$ access information signal AIF(N+1)<1:K> may be counted by increasing a value of the (N+1)$^{th}$ access information signal AIF(N+1)<1:K> by an increment of one. That is, the (N+1)$^{th}$ row address RADD<N+1> is selected as a neighboring address, a value of the (N+1)$^{th}$ access information signal AIF(N+1)<1:K> is incremented by one.

As described above, a semiconductor device according to an embodiment may reset an access information signal corresponding to a row address that is selected as a target address, and may count an access information signal corresponding to a row address that is set as a neighboring address. Electric charge stored in memory cells connected to a neighboring word line selected by the row address set as the neighboring address may be lost due to interference between a target word line selected by the row address selected as the target address and the neighboring word line selected by the row address set as the neighboring address. Thus, a refresh operation may be performed to refresh memory cells connected to a word line when the word line is selected as a neighboring word line more than a predetermined number of times.

Figure 5:
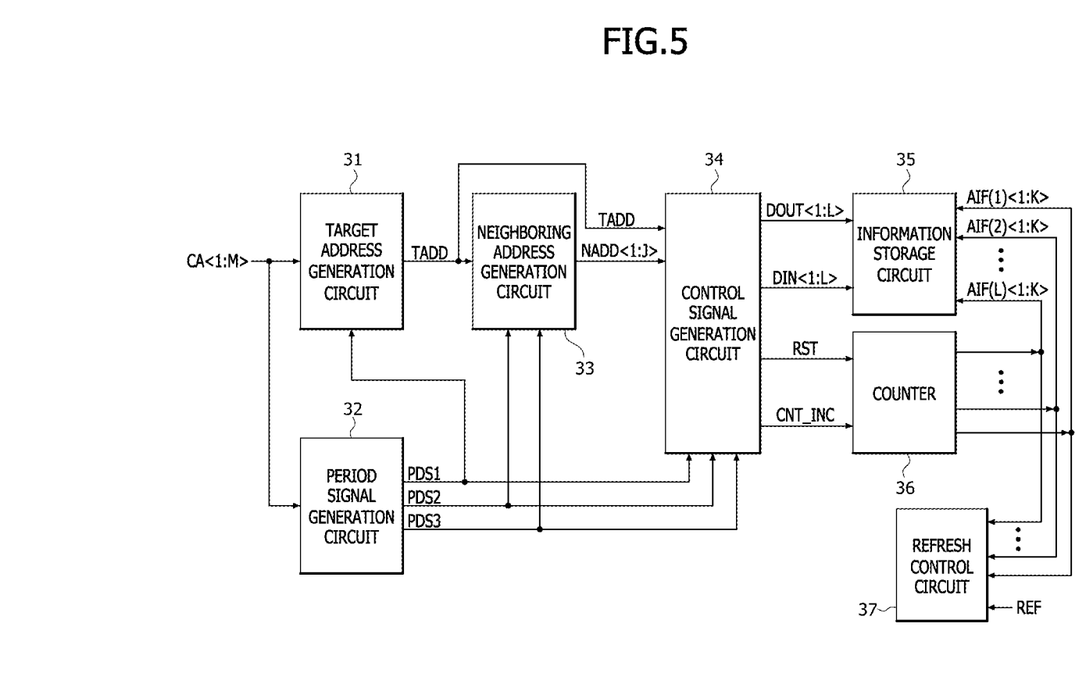
FIG. 5 is a block diagram illustrating a semiconductor device according to another embodiment of the present disclosure.

FIG. 5 is a block diagram illustrating a semiconductor device according to another embodiment of the present disclosure. The semiconductor device may include a target address generation circuit 31, a period signal generation circuit 32, a neighboring address generation circuit 33, a control signal generation circuit 34, an information storage circuit 35, a counter 36, and a refresh control circuit 37.

The target address generation circuit 31 may generate a target address TADD based on data of address bits included in a command/address signal CA<1:M>, in response to a first period signal PDS1. The target address generation circuit 31 may decode the data of the address bits included in the command/address signal CA<1:M> and generate the target address TADD during a first period when the first period signal PDS1 is enabled. The first period may be set to be a period from a point of time when a predetermined internal operation starts until a point of time when a predetermined time elapses after the predetermined internal operation starts.

The command/address signal CA<1:M> may include at least one of a command and an address signal. The number "M" of bits included in the command/address signal CA<1:M> may be set at different values according to different embodiments. The target address TADD may be set to correspond to a row address, which is enabled by decoding the data of the address bits included in the command/address signal CA<1:M>. The row address may be enabled to activate any one of word lines. The enabled row address may change according to a logic level combination of the data of the address bits included in the command/address signal CA<1:M>.

The period signal generation circuit 32 may generate the first period signal PDS1, a second period signal PDS2, and a third period signal PDS3, based on the command/address signal CA<1:M>. The period signal generation circuit 32 may decode command bits included in the command/address signal CA<1:M>, and generate the first period signal PDS1 that is enabled during the first period, the second period signal PDS2 that is enabled during a second period, and the third period signal PDS3 that is enabled during a third period. The first to third periods may be set by dividing a period when the predetermined internal operation is performed.

For example, a period when an active operation is performed may be divided into the first to third periods. The period signal generation circuit 32 may decode the command bits included in the command/address signal CA<1:M> and generate the first to third period signals PDS1, PDS2, and PDS3, which are sequentially enabled during the period when the active operation is performed.

Therefore, the first to third period signals PDS1, PDS2, and PDS3 may be generated to be sequentially enabled during a period when at least one of various internal operations such as a read operation, a write operation, a refresh operation, and a standby operation is performed, according to embodiments.

The neighboring address generation circuit 33 may generate first to $J^{th}$ neighboring addresses NADD<1:J> based on the target address TADD, in response to the second and third period signals PDS2 and PDS3. The neighboring address generation circuit 33 may select row addresses neighboring with a target row address corresponding to the target address TADD as the first to $J^{th}$ neighboring addresses NADD<1:J> during the second and third periods when the second and third period signals PDS2 and PDS3 are enabled.

If the number "J" of bits included in the first to $J^{th}$ neighboring addresses NADD<1:J> is two, a row address adjacent to the target row address in a first direction may be selected as the first neighboring address NADD<1> during the second period, and a row address adjacent to the target row address in a second direction may be selected as the second neighboring address NADD<2> during the third period. The second direction may be opposite to the first direction.

If the number "J" of bits included in the first to $J^{th}$ neighboring addresses NADD<1:J> is four, two row addresses adjacent to the target row address in the first direction may be selected as the first and second neighboring addresses NADD<1:2> during the second period, and two row addresses adjacent to the target row address in the second direction may be selected as the third and fourth neighboring addresses NADD<3:4> during the third period.

The control signal generation circuit 34 may generate first to $L^{th}$ output control signals DOUT<1:L>, first to $L^{th}$ input control signals DIN<1:L>, and a reset signal RST based on the first period signal PDS1 and the target address TADD. The control signal generation circuit 34 may generate the first to $L^{th}$ output control signals DOUT<1:L>, which are enabled to output access information on the number of times that a row address corresponding to the target address TADD is selected during the first period when the first period signal PDS1 is enabled.

For example, if an $N^{th}$ row address RADD<N> is selected as the target address TADD, the $N^{th}$ output control signal DOUT<N>, which is enabled during the first period, may be generated. The $N^{th}$ input control signal DIN<N> corresponding to the $N^{th}$ row address RADD<N> may be enabled after the first period ends. The control signal generation circuit 34 may generate the reset signal RST, which is enabled during the first period.

The control signal generation circuit 34 may generate the first to $L^{th}$ output control signals DOUT<1:L>, the first to $L^{th}$ input control signals DIN<1:L>, and a count increment signal CNT_INC based on the second and third period signals PDS2 and PDS3 and the first to $J^{th}$ neighboring addresses NADD<1:J>. The control signal generation circuit 34 may generate the first to $L^{th}$ output control signals DOUT<1:L>, which are enabled to output access information on the number of times that row addresses corresponding to the first to $J^{th}$ neighboring addresses NADD<1:J> are selected during the second and third periods when the second and third period signals PDS2 and PDS3 are enabled.

If the $N^{th}$ row address RADD<N> is selected as the target address TADD, the control signal generation circuit 34 may generate the $(N-1)^{th}$ output control signal DOUT<N-1>, which is enabled to output access information on the number of times that the $(N-1)^{th}$ row address RADD<N-1> is selected as a neighboring address, during the second period. The $(N-1)^{th}$ input control signal DIN<N-1> corresponding to the $(N-1)^{th}$ row address RADD<N-1>, which is selected as the first neighboring address NADD<1>, may be enabled after the second period ends.

If the $N^{th}$ row address RADD<N> is selected as the target address TADD, the control signal generation circuit 34 may generate the $(N+1)^{th}$ output control signal DOUT<N+1>, which is enabled to output access information on the number of times that the $(N+1)^{th}$ row address RADD<N+1> is selected as a neighboring address, during the third period. The $(N+1)^{th}$ input control signal DIN<N+1> corresponding to the $(N+1)^{th}$ row address RADD<N+1>, which is selected as the second neighboring address NADD<2>, may be enabled after the third period ends. The control signal generation circuit 34 may generate the count increment signal CNT_INC, which is enabled during the second and third periods.

The information storage circuit 35 may include a plurality of storage circuits (not shown), which are capable of storing first to $L^{th}$ access information signals AIF(1)<1: K>~AIF(L)<1:K>. The information storage circuit 35 may output the first to $L^{th}$ access information signals AIF(1)<1:K>~AIF(L)<1:K> stored therein in response to the first to $L^{th}$ output control signals DOUT<1:L>. The information storage circuit 35 may receive the first to $L^{th}$ access information signals AIF(1)<1:K>~AIF(L)<1:K> from the counter 36 and store the first to $L^{th}$ access information signals AIF(1)<1:K>~AIF(L)<1:K> therein, in response to the first to $L^{th}$ input control signals DIN<1:L>. A configuration of the information storage circuit 35 will be described in detail with reference to FIG. 6.

The counter 36 may generate the first to $L^{th}$ access information signals AIF(1)<1:K>~AIF(L)<1:K> in response to the reset signal RST and the count increment signal CNT_INC. The counter 36 may initialize the first to $L^{th}$ access information signals AIF(1)<1:K>~AIF(L)<1:K> so that the first to $L^{th}$ access information signals AIF(1)<1:K>~AIF(L)<1:K> have initial values when the reset signal RST is enabled. The counter 36 may initialize any one access information signal, which is selected from the first to $L^{th}$ access information signals AIF(1)<1:K>~AIF(L)<1:K> by a corresponding one of the first to $L^{th}$ output control signals DOUT<1:L> that is enabled, in response to the enabled reset signal RST during the first period, so that the selected access information signal has an initial value. The counter 36 may count any one access information signal, which is selected from the first to $L^{th}$ access information signals AIF(1)<1:K>~AIF(L)<1:K> by a corresponding one of the first to $L^{th}$ output control signals DOUT<1:L> that is enabled, in response to the count increment signal CNT_INC, which is enabled during each of the second and third periods.

In this embodiment, the access information signal, which has been initialized or counted-up, is stored in the information storage circuit 35 in response to a corresponding one of the first to $L^{th}$ input control signals DIN<1:L>. At the same time, the access information signal, which has been initialized or counted-up, is also provided to the refresh control circuit 37.

The refresh control circuit 37 may perform a refresh operation in response to the first to $L^{th}$ access information signals AIF(1)<1:K>~AIF(L)<1:K>. The refresh control circuit 37 may perform a refresh operation for memory cells (not shown) selected by a row address corresponding to an access information signal, which is counted by more than a predetermined number of times (or maximum counter value), from among the first to $L^{th}$ access information signals AIF(1)<1:K>~AIF(L)<1:K>. That is, the refresh operation is performed on memory cells (not shown) that are selected by a row address corresponding to an access information signal, which has a value greater than the predetermined number of times.

Figure 6:
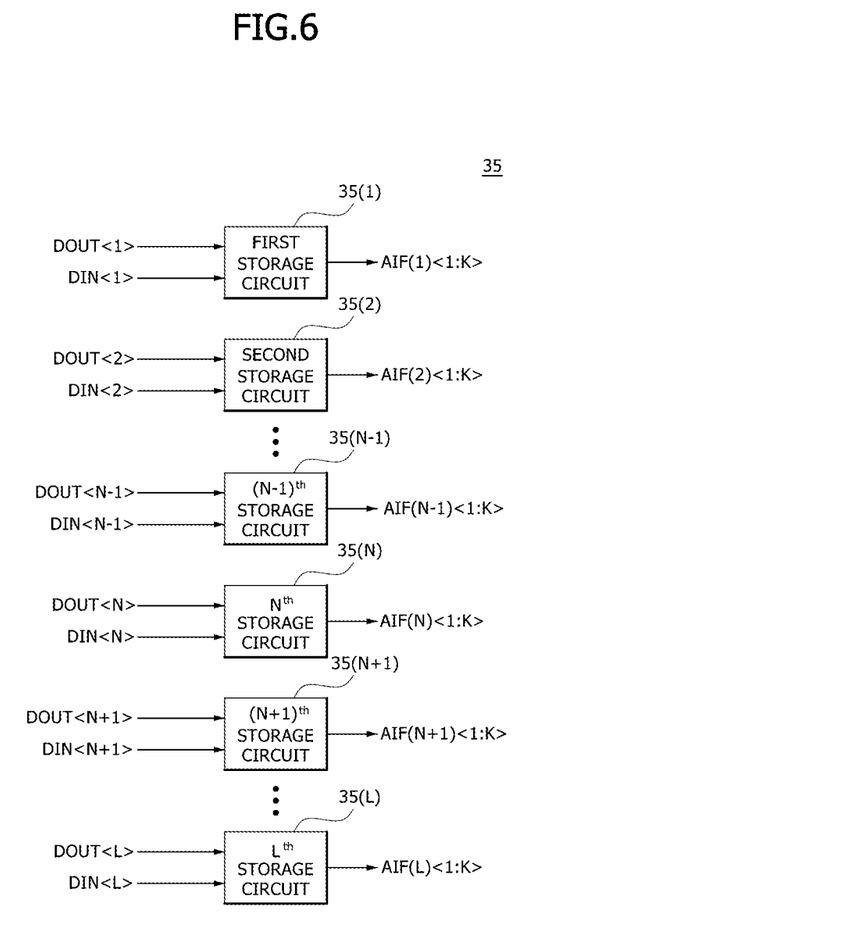
FIG. 6 is a block diagram illustrating an information storage circuit included in the semiconductor device of FIG. 5 according to an embodiment of the present disclosure.

FIG. 6 is a block diagram illustrating the information storage circuit 35 included in the semiconductor device of FIG. 5 according to an embodiment of the present disclosure. The information storage circuit 35 may include first to $L^{th}$ storage circuits 35(1)~35(L).

The first storage circuit 35(1) may output the first access information signal AIF(1)<1:K> to the counter 36 in response to the first output control signal DOUT<1>, and receive the first access information signal AIF(1)<1:K> from the counter 36 in response to the first input control signal DIN<1>. The first storage circuit 35(1) may output the first access information signal AIF(1)<1:K> stored therein when the first output control signal DOUT<1> is enabled. The first storage circuit 35(1) may receive and store the first access information signal AIF(1)<1:K> therein when the first input control signal DIN<1> is enabled.

The second storage circuit 35(2) may output the second access information signal AIF(2)<1:K> to the counter 36 in response to the second output control signal DOUT<2>, and receive the second access information signal AIF(2)<1:K> from the counter 36 in response to the second input control signal DIN<2>. The second storage circuit 35(2) may output the second access information signal AIF(2)<1:K> stored therein when the second output control signal DOUT<2> is enabled. The second storage circuit 35(2) may receive and store the second access information signal AIF(2)<1:K> therein when the second input control signal DIN<2> is enabled.

The $(N-1)^{th}$ storage circuit 35(N-1) may output the $(N-1)^{th}$ access information signal AIF(N-1)<1:K> to the counter 36 in response to the $(N-1)^{th}$ output control signal DOUT<N-1>, and receive the $(N-1)^{th}$ access information signal AIF(N-1)<1:K> from the counter 36 in response to the $(N-1)^{th}$ input control signal DIN<N-1>. The $(N-1)^{th}$ storage circuit 35(N-1) may output the $(N-1)^{th}$ access information signal AIF(N-1)<1:K> stored therein when the $(N-1)^{th}$ output control signal DOUT<N-1> is enabled. The $(N-1)^{th}$ storage circuit 35(N-1) may receive and store the $(N-1)^{th}$ access information signal AIF(N-1)<1:K> therein when the $(N-1)^{th}$ input control signal DIN<N-1> is enabled.

The $N^{th}$ storage circuit 35(N) may output the $N^{th}$ access information signal AIF(N)<1:K> to the counter 36 in response to the $N^{th}$ output control signal DOUT<N>, and receive the $N^{th}$ access information signal AIF(N)<1:K> from the counter 36 in response to the $N^{th}$ input control signal DIN<N>. The $N^{th}$ storage circuit 35(N) may output the $N^{th}$ access information signal AIF(N)<1:K> stored therein when the $N^{th}$ output control signal DOUT<N> is enabled. The $N^{th}$ storage circuit 35(N) may receive and store the $N^{th}$ access information signal AIF(N)<1:K> therein when the $N^{th}$ input control signal DIN<N> is enabled.

The $(N+1)^{th}$ storage circuit 35(N+1) may output the $(N+1)^{th}$ access information signal AIF(N+1)<1:K> to the counter 36 in response to the $(N+1)^{th}$ output control signal DOUT<N+1>, and receive the $(N+1)^{th}$ access information signal AIF(N+1)<1:K> from the counter 36 in response to the $(N+1)^{th}$ input control signal DIN<N+1>. The $(N+1)^{th}$ storage circuit 35(N+1) may output the $(N+1)^{th}$ access information signal AIF(N+1)<1:K> stored therein when the $(N+1)^{th}$ output control signal DOUT<N+1> is enabled. The $(N+1)^{th}$ storage circuit 35(N+1) may receive and store the $(N+1)^{th}$ access information signal AIF(N+1)<1:K> therein when the $(N+1)^{th}$ input control signal DIN<N+1> is enabled.

The $L^{th}$ storage circuit 35(L) may output the $L^{th}$ access information signal AIF(L)<1:K> to the counter 36 in response to the $L^{th}$ output control signal DOUT<L>, and receive the $L^{th}$ access information signal AIF(L)<1:K> from the counter 36 in response to the $L^{th}$ input control signal DIN<L>. The $L^{th}$ storage circuit 35(L) may output the $L^{th}$ access information signal AIF(L)<1:K> stored therein when the $L^{th}$ output control signal DOUT<L> is enabled. The $L^{th}$ storage circuit 35(L) may receive and store the $L^{th}$ access information signal AIF(L)<1:K> therein when the $L^{th}$ input control signal DIN<L> is enabled.

Figure 7:
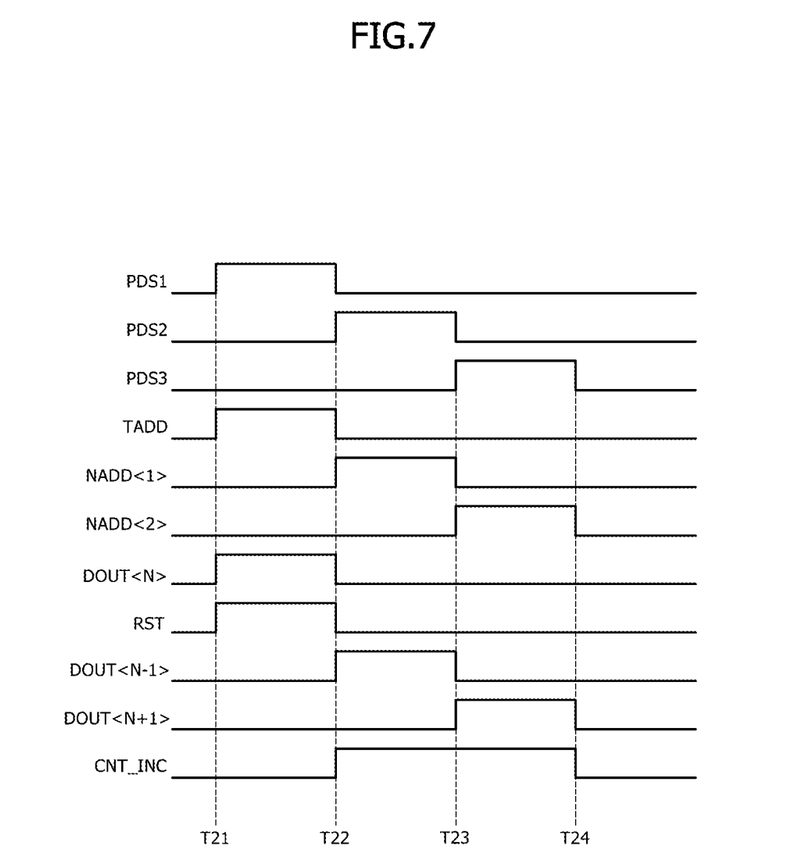
FIG. 7 is a timing diagram illustrating an operation of the semiconductor device illustrated in FIGS. 5 and 6.

An operation of the semiconductor device having the aforementioned configuration will be described hereinafter in detail with reference to FIG. 7 in conjunction with an example in which the number "J" of bits included in the first to $J^{th}$ neighboring addresses NADD<1:J> is two, and an active period T21~T24 when an active operation is performed is divided into a first period T21~T22, a second period T22~T23, and a third period T23~T24.

During the first period T21~T22 when the first period signal PDS1 is enabled, the $N^{th}$ row address RADD<N> may be selected as the target address TADD. The $N^{th}$ output control signal DOUT<N>, which corresponds to the $N^{th}$ row address RADD<N>, and the reset signal RST may be enabled to have a logic "high" level as the $N^{th}$ row address RADD<N> is selected as the target address TADD. The $N^{th}$ access information signal AIF(N)<1:K> may be initialized to have an initial value by the $N^{th}$ output control signal DOUT<N> and the reset signal RST.

During the second period T22~T23 when the second period signal PDS2 is enabled, the $(N-1)^{th}$ row address RADD<N-1> may be selected as the first neighboring address NADD<1> when the $N^{th}$ row address RADD<N> is selected as the target address TADD. The $(N-1)^{th}$ output control signal DOUT<N-1>, which corresponds to the $(N-1)^{th}$ row address RADD<N-1>, and the count increment signal CNT_INC may be enabled to have a logic "high" level. As a result, the $(N-1)^{th}$ access information signal AIF(N-1)<1:K> may be counted by the count increment signal CNT_INC, by increasing a value of the $(N-1)^{th}$ access information signal AIF(N-1)<1:K> by an increment of one.

During the third period T23~T24 when the third period signal PDS3 is enabled, the $(N+1)^{th}$ row address RADD<N+1> may be selected as the second neighboring address NADD<2> when the $N^{th}$ row address RADD<N> is selected as the target address TADD. The $(N+1)^{th}$ output control signal DOUT<N+1>, which corresponds to the $(N+1)^{th}$ row address RADD<N+1>, and the count increment signal CNT_INC may be enabled to have a logic "high" level. The $(N+1)^{th}$ access information signal AIF(N+1)<1:K> may be counted by the count increment signal CNT_INC by increasing a value of the $(N+1)^{th}$ access information signal AIF(N+1)<1:K> by an increment of one.

As described above, a semiconductor device according to another embodiment may reset a value of an access information signal corresponding to a row address, which is selected as a target address, and may count a value of an access information signal corresponding to a row address, which is set as a neighboring address. Electric charges stored in memory cells connected to a neighboring word line selected by the row address set as the neighboring address may be lost due to interference between a target word line, which is selected by the row address set as the target address, and the neighboring word line, which is selected by the row address set as the neighboring address. Thus, a refresh operation may be performed to refresh memory cells connected to a word line when the word line is selected as a neighboring word line more than a predetermined number of times. As a result, a speed of the refresh operation may be improved and power consumption may be reduced during the refresh operation. In addition, a counter may be shared while the access information signals are counted or initialized because counting operations for the access information signals are sequentially performed in response to the first to $L^{th}$ output control signals DOUT<1:L>, which are selectively enabled. Accordingly, the number of counters may be reduced in order to decrease a layout area of the semiconductor device.

Figure 8:
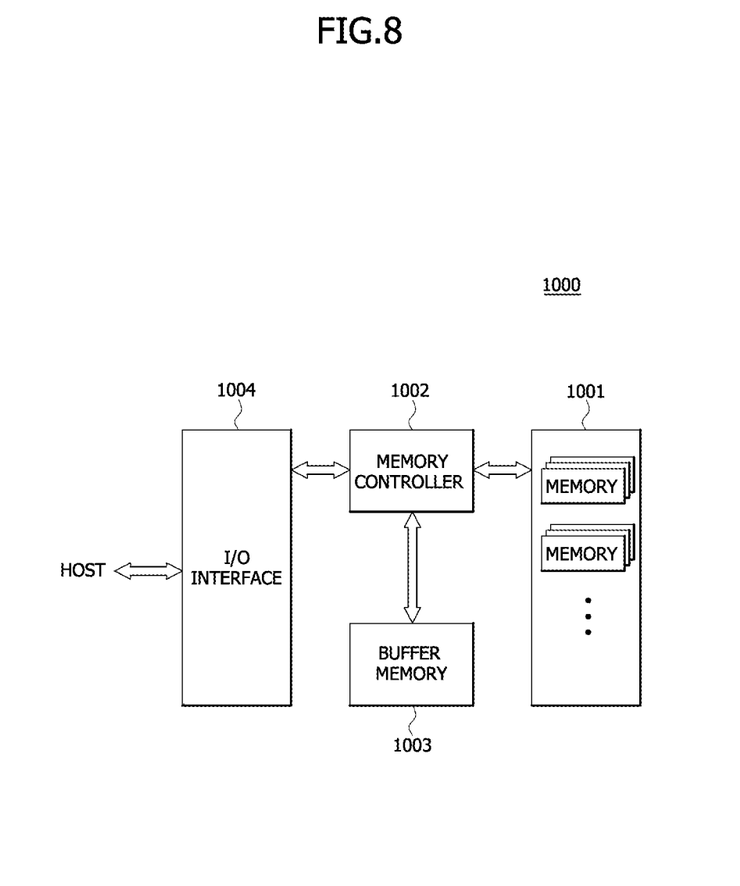
FIG. 8 is a block diagram illustrating an electronic system including at least one of the semiconductor devices illustrated in FIGS. 1 and 5 according to an embodiment of the present disclosure.

At least one of the semiconductor devices described with reference to FIGS. 1 to 7 may be applied to an electronic system that includes a memory system, a graphic system, a computing system, a mobile system, or the like. For example, as illustrated in FIG. 8, an electronic system 1000 according an embodiment may include a data storage circuit 1001, a memory controller 1002, a buffer memory 1003, and an input/output (I/O) interface 1004.

The data storage circuit 1001 may store data transmitted from the memory controller 1002, or may read and output the stored data to the memory controller 1002, in response to a control signal generated by the memory controller 1002. The data storage circuit 1001 may include at least one of the semiconductor devices illustrated in FIGS. 1 and 5. Meanwhile, the data storage circuit 1001 may further include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command from an external device (e.g., a host device) through the I/O interface 1004 and may decode the command received from the host device to control an operation for storing data in the data storage circuit 1001 or the buffer memory 1003, or to control an operation for outputting the data stored in the data storage circuit 1001 or the buffer memory 1003. Although FIG. 8 illustrates the memory controller 1002 with a single block, the memory controller 1002 may include a first controller for controlling the data storage circuit 1001 comprised of a nonvolatile memory and a second controller for controlling the buffer memory 1003 comprised of a volatile memory.

The buffer memory 1003 may temporarily store data, which are processed by the memory controller 1002. That is, the buffer memory 1003 may temporarily store data, which are read from or to be stored in the data storage circuit 1001. The buffer memory 1003 may store the data, which are transmitted from the memory controller 1002, in response to a control signal generated by the memory controller 1002. The buffer memory 1003 may read out data from the data storage circuit 1001, temporarily store the read-out data, and output the read-out data to the memory controller 1002. The buffer memory 1003 may include a volatile memory such as a dynamic random access memory (DRAM), a mobile DRAM, a static random access memory (SRAM), or the like.

The I/O interface 1004 may physically and electrically connect the memory controller 1002 to the external device (e.g., the host device). Thus, the memory controller 1002 may receive control signals and data supplied by the external device (e.g., the host device) through the I/O interface 1004, and may output data from the memory controller 1002 to the external device (e.g., the host device) through the I/O interface 1004. That is, the electronic system 1000 may communicate with the host device through the I/O interface 1004. The I/O interface 1004 may include one or more of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), an integrated drive electronics (IDE), and so on.

The electronic system 1000 may be used as an auxiliary storage device of the host device or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A semiconductor device comprising:
   a counter control signal generation circuit configured to generate a count enablement signal, a first reset signal, a second reset signal, and a count increment signal based on a first row address selected as a target address and a second row address selected as a neighboring address of the target address; and
   an access information generation circuit configured to receive the count enablement signal, the first reset signal, the second reset signal, and the count increment signal and generate first and second access information signals, the first access information signal including information on the number of times that the first row address has been selected, the second access information signal including information on the number of times that the second row address has been selected,
   wherein the first reset signal is enabled to initialize the first access information signal when the first row address is selected as the target address.

2. The semiconductor device of claim 1, wherein the first row address is generated by decoding an address signal, and is enabled to activate a target word line.

3. The semiconductor device of claim 2, wherein the second row address is generated based on the first row address, and is enabled to activate a neighboring word line adjacent to the target word line.

4. The semiconductor device of claim 1, wherein the second access information signal is counted in response to the count enablement signal and the count increment signal.

5. The semiconductor device of claim 4, wherein the count enablement signal includes a first count enablement signal and a second count enablement signal.

6. The semiconductor device of claim 1, wherein the access information generation circuit includes a first counter that initializes the first access information signal in response to the first reset signal.

7. The semiconductor device of claim 5, wherein the second count enablement signal is enabled when the second row address is selected as the neighboring address.

8. The semiconductor device of claim 7, wherein the access information generation circuit includes a second counter that counts the second access information signal in response to the second count enablement signal and the count increment signal.

9. The semiconductor device of claim 1, further comprising a target address generation circuit that decodes the address signal and generates the first row address, the first row address being selected as the target address.

10. The semiconductor device of claim 1, further comprising a period signal generation circuit that decodes a command and generates a period signal, the period signal being enabled during a period when a predetermined internal operation is performed.

11. The semiconductor device of claim 10, wherein the predetermined internal operation includes any of an active operation, a read operation, a write operation, and a standby operation.

12. The semiconductor device of claim 1, further comprising a refresh control circuit configured to perform a refresh operation in response to the first and second access information signals.

13. A semiconductor device comprising:
a control signal generation circuit configured to generate, based on a first row address selected as a target address during a first period, a first output control signal, a first input control signal, and a reset signal, and to generate, based on a second row address selected as a neighboring address of the target address during a second period, a second output control signal, a second input control signal, and a count increment signal;
an information storage circuit configured to store and output a first access information signal and a second access information signal in response to the first input control signal, the first output control signal, the second input control signal, and the second output control signal, the first access information signal including information on the number of times that the first row address is selected, the second access information signal including information on the number of times that the second row address is selected; and
a counter configured to reset the first access information signal and count the second access information signal in response to the reset signal and the count increment signal, respectively, when the first and second output control signals are enabled.

14. The semiconductor device of claim 13, wherein the first and second periods are set by dividing a period when a predetermined internal operation is performed.

15. The semiconductor device of claim 13, wherein the control signal generation circuit is configured to generate the first output control signal and the reset signal, the first output control signal and the reset signal being enabled during the first period.

16. The semiconductor device of claim 15, wherein, when the first output control signal and the reset signal are enabled, the first access information signal is inputted to the counter and the counter is initialized.

17. The semiconductor device of claim 13, wherein the control signal generation circuit is configured to generate the second output control signal and the count increment signal, the second output control signal and the count increment signal being enabled during the second period.

18. The semiconductor device of claim 17, wherein, when the second output control signal and the count increment signal are enabled, the second access information signal is inputted to the counter and is counted.

19. The semiconductor device of claim 14, further comprising a period signal generation circuit configured to divide the period, in which the predetermined internal operation is performed, into the first period and the second period, and is configured to generate a first period signal, which is enabled during the first period, and a second period signal, which is enabled during the second period.

20. The semiconductor device of claim 13, further comprising a refresh control circuit configured to perform a refresh operation in response to the first and second access information signals.

* * * * *